United States Patent [19]

Corey

[11] 3,932,764
[45] Jan. 13, 1976

[54] TRANSFER SWITCH AND TRANSIENT ELIMINATOR SYSTEM AND METHOD
[75] Inventor: Philip D. Corey, Raleigh, N.C.
[73] Assignee: ESB Incorporated, Philadelphia, Pa.
[22] Filed: May 15, 1974
[21] Appl. No.: 470,284

[52] U.S. Cl. .................................... 307/85; 307/87
[51] Int. Cl.² .......................................... H02J 9/00
[58] Field of Search .......... 307/85, 87, 64, 66, 136, 307/70; 340/253 H

[56] References Cited
UNITED STATES PATENTS

| | | |
|---|---|---|
| 3,300,651 | 1/1967 | Larsen .............................. 307/64 X |
| 3,750,004 | 7/1973 | Walker ................................ 321/14 |
| 3,753,002 | 8/1973 | Jacobson et al. ...................... 307/87 |

*Primary Examiner*—James R. Scott
*Assistant Examiner*—M. Ginsburg
*Attorney, Agent, or Firm*—Anthony J. Rossi; Robert H. Robinson

[57] ABSTRACT

A method and apparatus is disclosed for transferring an electrical load to an inverter from a utility A.C. power source without causing transient changes in the voltage and current fed to the load when such transfer is effected.

3 Claims, 6 Drawing Figures

TRANSFER SWITCH AND TRANSIENT ELIMINATOR SYSTEM AND METHOD

BACKGROUND OF THE INVENTION

1. Field of the Invention

This invention relates to a static switching system and method for transferring an electrical load from a first electric power supply to a second electric power supply and to retransfer the load back to the first electric power supply, all as dictated by operating conditions and also eliminating transients in such retransferring.

2. Description of the Prior Art

It may be explained here that in applications of uninterruptible power supplies (UPS) to larger critical loads, e.g., a digital computer, there is a requirement that the electrical power supplied to the load be maintained at predetermined specifications in spite of (1) load step transients of all types, (2) failures of the UPS, (3) overloads of all types and (4) branch faults in the load equipment.

A typical prior art switching system is illustrated in block diagram form in FIG. 1. Thyristor switching is shown, however, other switching devices, including electromechanical, can be and are often employed. In the system shown in FIG. 1, the critical loads are fed normally from the power conditioning equipment, which typically comprises a static inverter supplied from a continuously available source such as a battery and charger. Upon failure of the utility source, the energy stored in the battery is converted to regulated alternating current by the inverter, so that power continuity at the critical loads is maintained, with switching means $S_1$ remaining closed and $S_2$ open.

The transfer switch is used to supply the load from the utility during events such as:

a. loss of the inverter to an internal failure, or routine maintenance of other modules in the power conditioner chain; and b. need to use the large power capacity of the utility to start very high in rush loads or to clear load faults, both beyond the normal capability of the uninterruptible power conditioning equipment.

During utility operation, $S_1$ is opened, and $S_2$ closed. When operation from the inverter is again desired, the transfer switch poles are restored to their original state, $S_1$ closed and $S_2$ open.

A serious problem has heretofore occured at the instant of transfer from the utility to the inverter output, namely, the well known transient voltage dip which results when a sudden load step is applied to a power source, such as a static inverter, which contains inherent and unavoidable internal impedances with its transformers, filters, wiring, etc., FIG. 2 illustrates the typical transient voltage dip effect.

In the past, various means have been used in attempts to minimize this problem including:

a. oversizing the inverter or other power conditioning means so as to reduce the per-unit load step, so that the percent transient amplitude will also be reduced;

b. using special inverter designs such as step-wave or pulse width modulation approaches which tend to reduce the internal impedances within the power conditioning equipment. This approach again only reduces the effect by a given amount; the transient on transfer still occurs; and, c. inserting special compensating controls which transmit an impulse to the inverter voltage regulator at precisely the right time and in the precise amount necessary to minimize the transient on load application. While special controls such as this can sometimes be "tuned" to produce significant transient improvement on retransfer, very careful trimming adjustments are necessary for each individual equipment and application, seriously impairing the practicality of this approach.

Hence, for previous attempts to solve the transfer transient problem, the transient event illustrated in FIG. 2 still applies (to a greater or lesser degree, of course, depending on the success of approaches outlined above). Contrasting with prior art, the transfer switching system, in accordance with the present invention, has the capability of completely eliminating the transfer transient, even when applied in conjunction with conventional types of power conditioning equipment which may be inherently slow in control response and contain relatively high internal electrical impedances, and therefore be particularly prone to transients due to step loading were it not for the apparatus and method of the present invention.

SUMMARY OF THE INVENTION

In accordance with the invention, there is provided a method and apparatus for transferring an electrical load to a first electrical supply comprising an inverter and including voltage and phase regulating means, from a second electrical supply comprising a utility A.C. source. Static switching is provided and is operated to connect the inverter and utility in parallel across the load prior to such transfer. The output current of the utility is sensed and used to effect operation of the voltage regulating and phase control means of the inverter to adjust the output voltage of the inverter and its relative phase so as to null the output current of the utility and cause the entire energy of the load to be supplied by the inverter. Thereafter, the static switching provided is operated to disconnect the load from the utility.

A more complete understanding of the invention will become apparent from the following detailed description, taken in conjunction with the accompanying drawings which form a part of this specification.

DESCRIPTION OF THE PREFERRED EMBODIMENT

In order to lay a foundation of the description of operation of transient eliminator for UPS with critical load transfer in accordance with the invention, a brief outline of the characteristics thereof will first be given together with a partial description of the functions of certain of the components shown in FIG. 3. The functions of various components not given in this brief outline will, however, become evident or appear in the description of operation of the transfer switching system of the invention.

Figure 3:
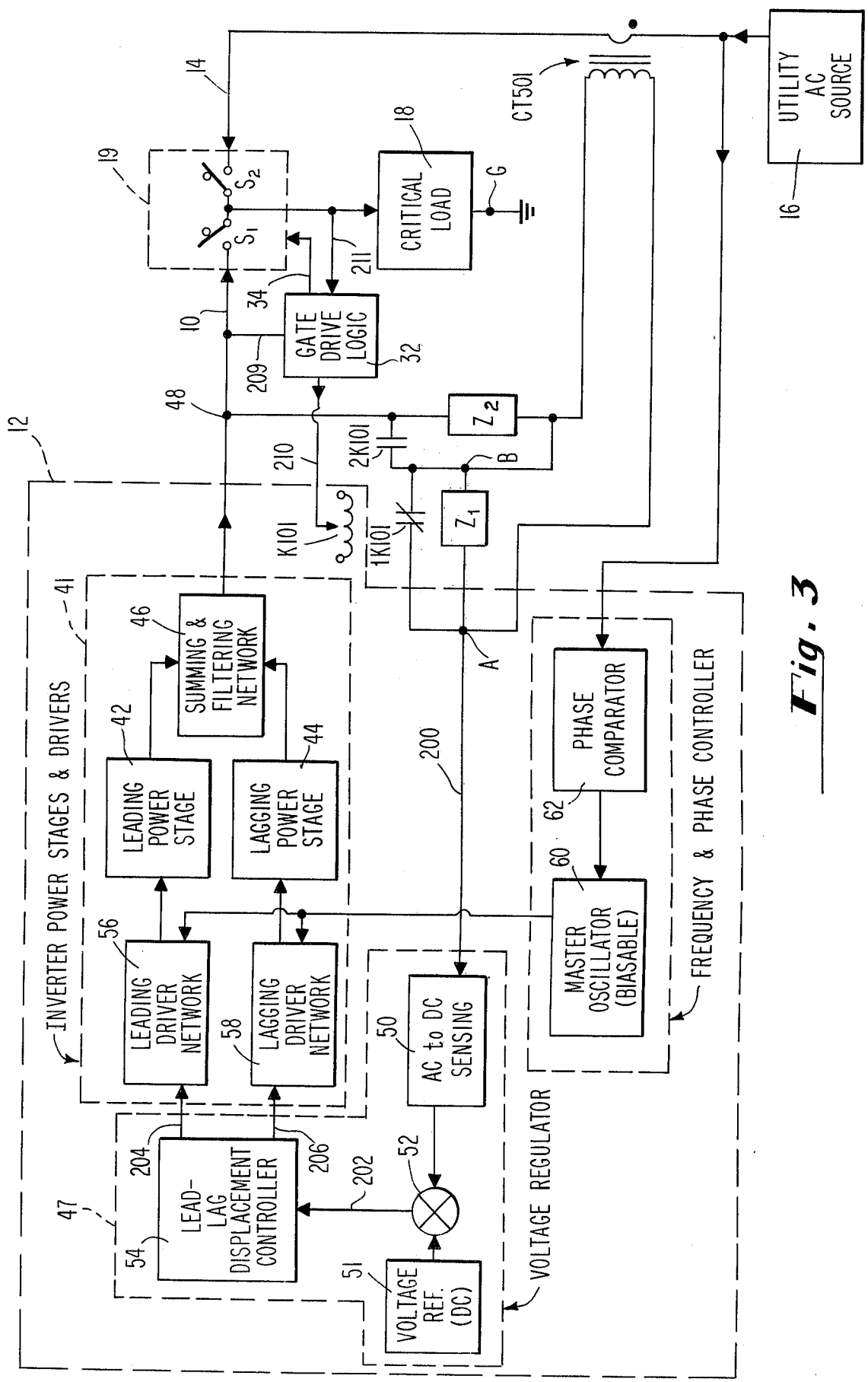
FIG. 3 illustrates a block diagram of an inverter and transfer switching system in accordance with the invention.

In the embodiment of FIG. 3, line 10 represents the output from a preferred supply, namely, the inverter 12, while line 14 represents the output from a non-preferred supply, namely, the utility 16. A load component is indicated at 18 which is normally to be energized from the preferred supply or inverter 12 but which in the event of failure or other dictated operating condition of the preferred supply, is to receive energy from the non-preferred supply or utility 16. A static transfer switch component is illustrated at 19. Simple single pole switches are illustrated in FIG. 3 as they represent the function performed, however, other switching devices such as thyristors may actually be employed in implementing the transfer switching system of the invention. As for example, there is illustrated in FIG. 1 various thyristor components for use in implementing the transfer switching system of the invention.

Figure 1:
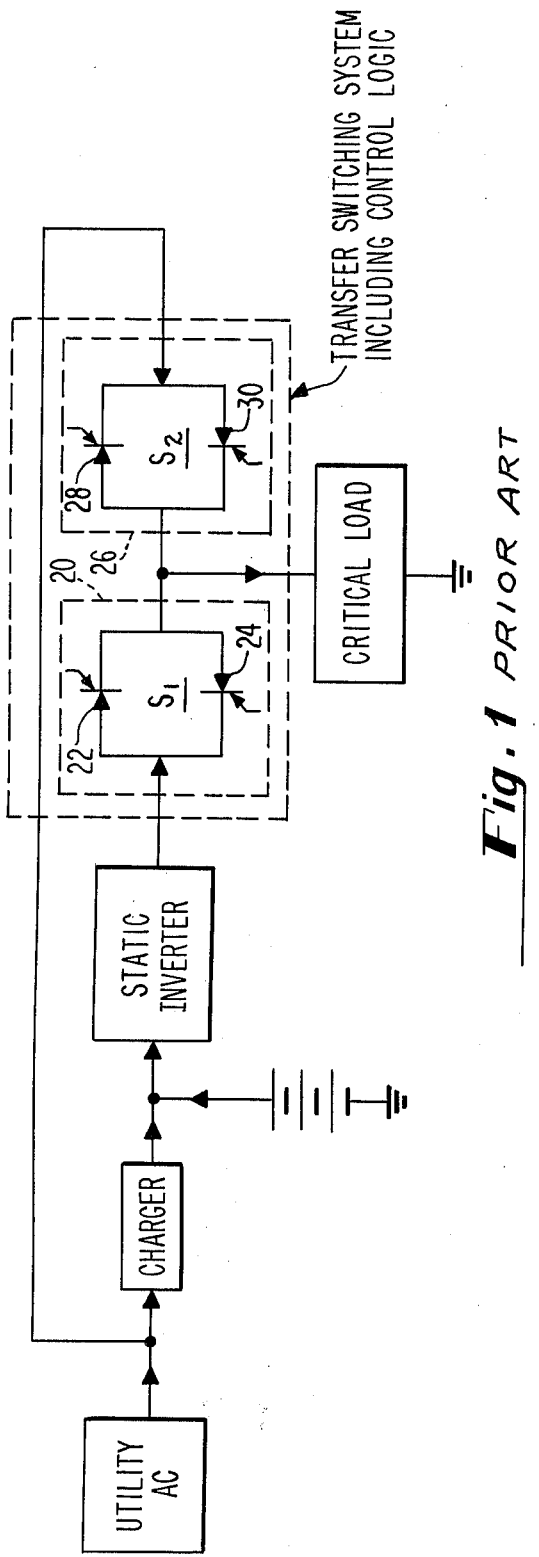
FIG. 1 illustrates a typical prior art inverter and transfer switching system.

In FIG. 1, a preferred thyristor component 20 represents suitable controllable static switch components such as silicon controlled rectifiers 22 and 24 and a non-preferred thyristor component 26 may comprise any suitable static switch components such as silicon controlled rectifiers 28 and 30.

In FIG. 3, a gate drive logic component 32 is illustrated as being coupled to the static transfer switch 19 by means of a line 34. It should be pointed out here that in practice two gate drive logic components can be provided, one for the preferred thyristor component and one for the non-preferred thyristor component.

Preferred and non-preferred thyristor components as well as static transfer switch components are well-known in the art, and a further description and diagram thereof may be found in U.S. Pat. No. 3,300,651 which is hereby incorporated herein by reference. The basic principles and mode of operation of these latter type components are fully set forth in U.S. Pat. No. 3,300,651. For the present discussion, however, it is only necessary to understand that in prior art systems, when the preferred supply 12 fails, for example, gate drive component 32 automatically shuts off the preferred thyristor component, represented in FIG. 3 as $S_1$, and activates the non-preferred thyristor component, represented in FIG. 3 as $S_2$, to supply load 18 from the utility 16. Upon return of the preferred supply 12, gate drive component 32 automatically activates the preferred thyristor component and, following a smoothly controlled transfer of load to the inverter as described herein, automatically shuts off the non-preferred thyristor component.

Turning now to the inverter portion of FIG. 3, namely, that portion represented by the block 12, the inverter 12 includes a power section 41 which comprises, inter alia, a Leading Power Stage 42 and a Lagging Power Stage 44. The outputs of these two stages are summed and filtered in the Summing & Filtering Network 46 whose output in turn appears as the inverter output on line 10. The inverter output voltage and current are sensed by normal analog means. The voltage regulating function of the inverter 12 is provided by Voltage Regulator 47. The output voltage of the inverter 12 is sensed at point 48 in line 10 and is coupled to AC to DC Sensing Network 50 via impedance $Z_2$, normally closed contacts 1K101 and line 200. The sensed voltage is compared to a reference, as provided by Voltage Reference Network 51, in Summing Network 52. The output of the Summing Network 52 is coupled via line 202 to LEAD-LAG Displacement Controller Network 54 which in turn is coupled to Leading Driver Network 56 via line 204 and Lagging Driver Network 58 via line 206.

The frequency of the inverter output is determined by a Master Oscillator 60 and the synchronization of the inverter to the utility AC source 16 is determined by the Phase Comparator Network 62.

For a more complete description of the inverter portion 12 of FIG. 3, see U.S. Pat. No. 3,750,004 which is hereby incorporated herein by reference. The principles and mode of operation of the inverter 12 are fully set forth in U.S. Pat. No. 3,750,004. For the present discussion, however, it is only necessary to understand that the output of the inverter 12 is formed by two waves, one produced by the LEADING Power Stage 42 and one by the LAGGING Power Stage 44. The two waves are operated at variable phase displacement from one another, and the resulting waves are combined to produce an output wave whose amplitude is controlled by the value of the relative phase displacement. The Voltage Regulator 47 of the inverter 12 causes changes in the output waveform of each of the Leading and Lagging Power Stages 42 and 44, respectively, such that the waveforms of each of them remain substantially identical to each other at all positions of the voltage regulating function.

The operation of transient eliminator aspect of the present invention will now be described, however, it should be pointed out here that the components making up the transient eliminator feature of the invention are interposed essentially in the voltage and phase regulating loops of the inverter 12 and, except for the modifications they provide, as will be described hereinafter, operation of the inverter 12 and transfer switch component 19, function in the manner as essentially described in the above mentioned two U.S. patents.

The components making up the transient eliminator aspect of the invention comprise the current transformer CT501, burden impedances $Z_1$ and $Z_2$, parallel control or "over-lap" relay coil K101 and its associated contacts, normally closed contacts 1K101 and normally open contacts 2K101, all connected as indicated in FIG. 3. Energizing or control current for relay coil K101 is derived from Gate Drive Logic component 32 via line 210. In addition to providing gate signals, in response to control logic commands, to cause conduction of the SCR's of the transfer switch component 19, the Gate Drive Logic 32 provides mechanization of the Boolean logic function $K101=S_1 \cdot S_2$ which expression simply means: energize relay coil K101 whenever both sections of the static switch are gated into conduction, i.e., both $S_1$ and $S_2$ closed. Further, Gate Drive Logic component 32 provides desired system sensing via lines 209 and 211 to initiate static switch transfer action. This may suitably be functionally of the form described in U.S. Pat. No. 3,300,651 cited above. More complex system control logic is, of course, possible in Gate Drive Logic component 32, as for example, it may provide blown inverter fuse sensing, syncronizing verification sensing, utility over/under voltage sensing, utility over/under frequency sensing, inverter over-/under voltage sensing and load current surge sensing.

Each of these functions would initiate appropriate static switch transfer action, i.e. effecting opening and closing of the switches $S_1$ and $S_2$.

The transient eliminator aspect of the invention will now be described. In operation, during transfer from the utility to the inverter power supply an intentional "overlap" or "make-before-break" operation is effected such that both switches $S_1$ and $S_2$ of the transfer switch component 19 are held closed for a predetermined time interval. Before describing the operation of the transient eliminator aspect of the invention further, it should be pointed out that the Gate Drive Logic component 32 is providing gating signals to the utility or non-preferred side thyristors ($S_2$) during utility operation. Under these conditions and, with the utility current not yet nulled, as will be explained, this provides the logic for the "overlap" wherein Gate Drive Logic component 32 provides gating signals to both preferred and non-preferred thyristors, i.e., $S_1$ and $S_2$ closed, thus connecting the inverter and utility in parallel during the interval when the load is being smoothly transferred from the utility to the inverter.

Continuing with the operation of the transient eliminator aspect of the invention and still referring to FIG. 3 a current transformer CT 501 senses the utility current by generating a current-proportional voltage across burden impedance $Z_1$ when enabled by the parallel control relay K101. This current-proportional voltage is simply connected in series with the voltage sensed by the inverter Phase Comparator circuit 62 and the Voltage Regulator 47.

When the load 18 is supplied by either inverter or utility alone, relay coil K101 is de-energized, therefore, contacts 1K101 and 2K101 are as shown in FIG. 3, current transformer CT501 is shorted out and dummy burden impedance $Z_2$ is inserted in the sensing line 200.

During the parallel operating "overlap" interval, relay coil K101 is energized by Gate Drive Logic 32, shorting out the dummy burden impedance $Z_2$ and inserting the utility current signal into the return path for the Voltage Regulator and Phase Comparator circuit 47 and 62, respectively.

Figure 4:
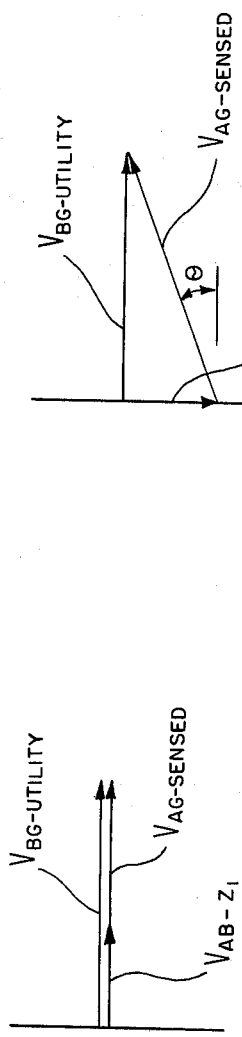
FIGS. 4 and 5 are diagrams useful to explain the invention.
Figure 5:
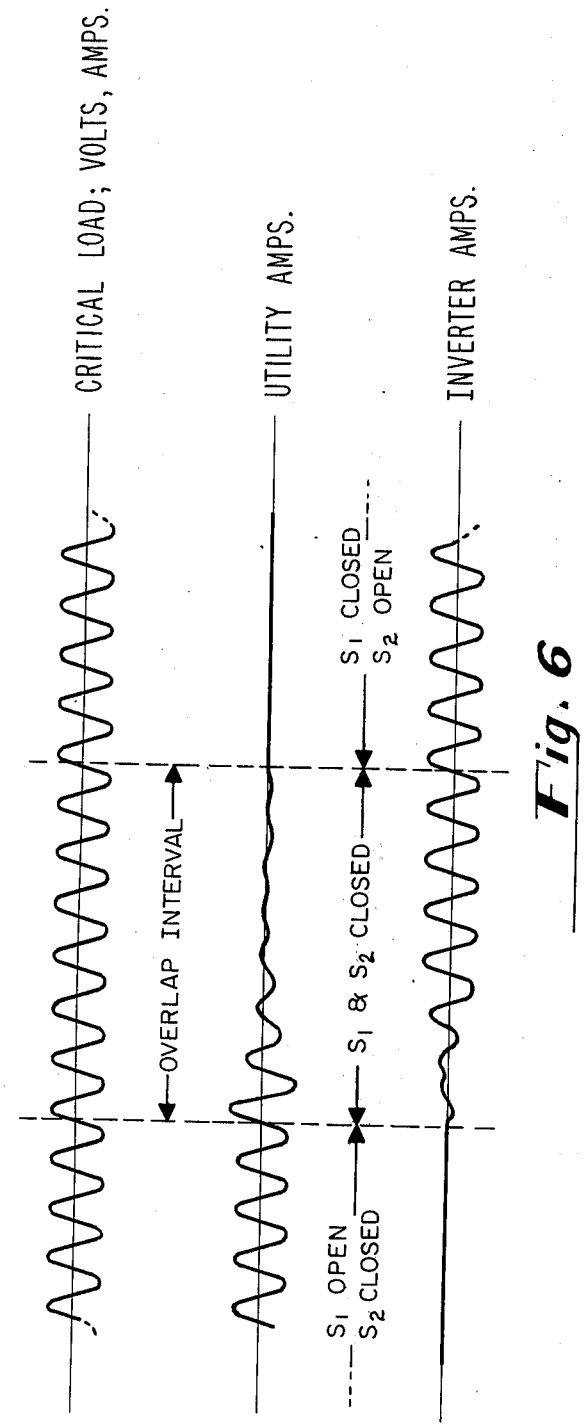

Referring now to FIGS. 4 and 5 it can be seen that the signals so generated cause the inverter voltage and phase to be biased in the directions to zero, or "null", the utility current. With the utility current nulled the non-preferred SCR's ($S_2$) can be allowed to turn off without load disturbance, since the nulling action transfers all load to the inverter, and there is therefore no transient when the non-preferred thyristor gating is removed. Essentially, in accordance with the invention, the non-preferred thyristors ($S_2$) are maintained on until the utility current is effectively brought to a null when transferring from the utility to the inverter.

In further explanation of FIGS. 4 and 5 and first referring to FIG. 4, assume the following condition for relay K101 energized and both $S_1$ and $S_2$ closed, that is, all thyristors gated on: the inverter's internal voltage is low, therefore, assuming resistive internal impedance the utility supplies a corresponding magnitude of real current. As such, the voltage sensed, that is, the voltage between points A and G of FIG. 3 ($V_{AG-sensed}$) appears low to the inverter Voltage Regulator 47; the voltage of the utility $V_{BG-utility}$ appears between points B and G of FIG. 3 and the voltage across impedance $Z_1$, $V_{AB-Z_1}$, appears across points A and B of FIG. 3. Since $V_{AG-sensed}$ appears low to the inverter Voltage Regulator 47, the Voltage Regulator 47 will up the voltage of the inverter 12 to "null" or zero the utility current. For simplicity there is no phase error in this first assumption.

Referring now to FIG. 5, assume the following condition: the voltages of the Utility and Inverter are matched, therefore, the Utility is supplying lagging current. As such, $V_{AG-sensed}$ appears all right to the Voltage Regulator 47, there is negligible error. However, the Phase Comparator 62 will under these conditions sense an apparent error, resulting in the proper bias to retard the phase of the inverter to "null" or zero the utility current.

It should be noted that FIGS. 4 and 5 illustrate the special case wherein the inverter internal impedance is predominantly resistive; hence, $Z_1$ and $Z_2$ are selected to be resistance elements to produce the proper biasing action on the voltage and phase controllers. As will be evident to one skilled in the art, if the teachings of the present invention are applied to an inverter of predominantly reactive internal impedance, proper control is obtained by making $Z_1$ and $Z_2$ corresponding reactive components; therefore, the teachings of the present invention are quite easily applied to inverters of general internal impedance, not specialized as shown here for ease of explanation.

Figure 2:
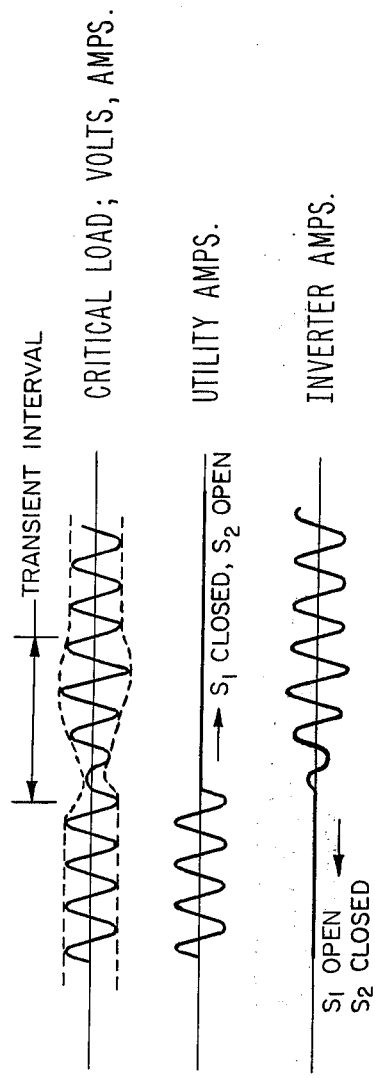
FIG. 2 illustrates a typical operating condition transient in a prior art inverter and transfer switching system.
Figure 6:
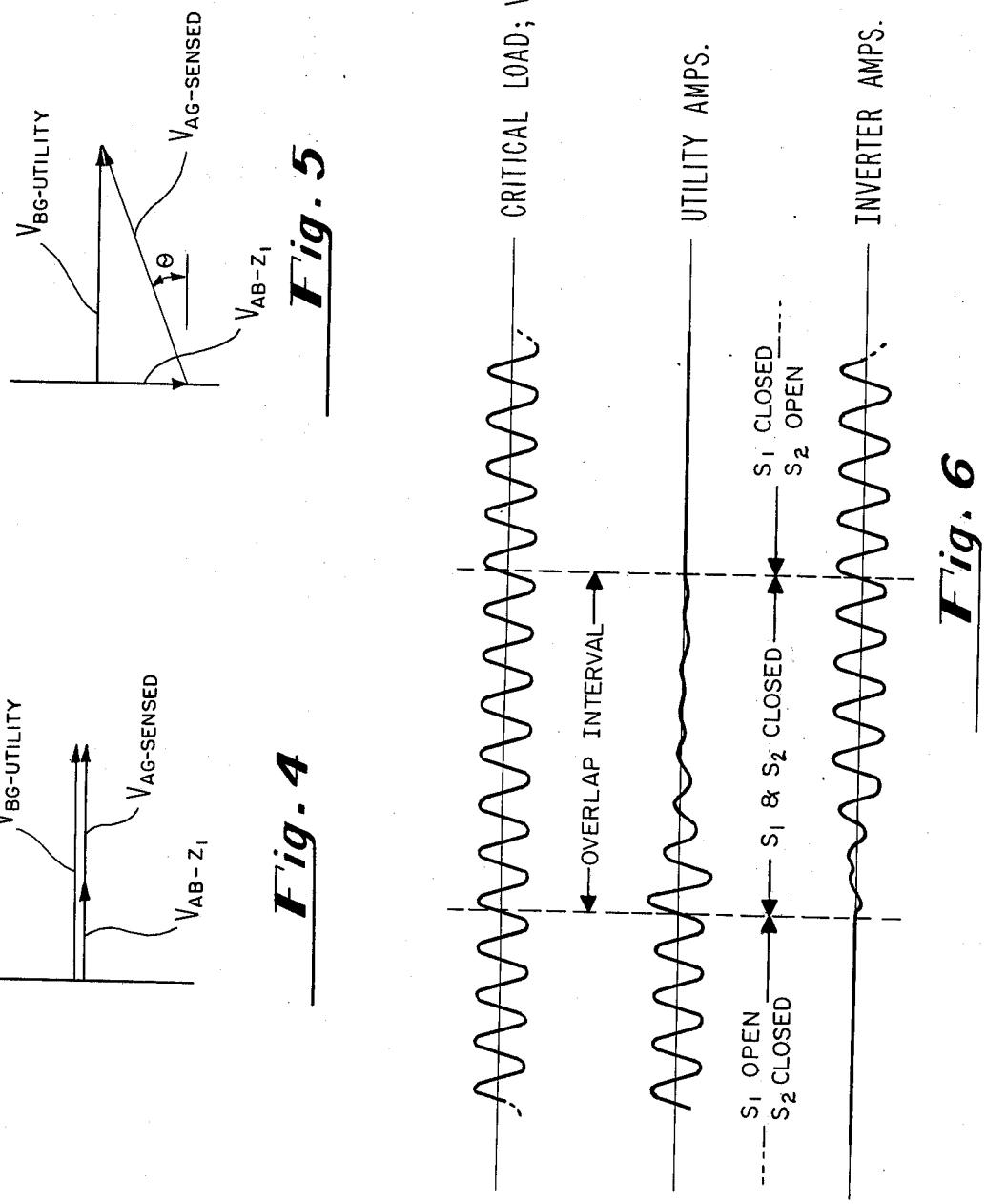
FIG. 6 illustrates that there is no transfer transient in the inverter and transfer switching system in accordance with the invention.

FIG. 6 shows operation and the waveforms of current and voltage of the inverter and utility with the transient eliminator aspect of the invention. Comparing FIGS. 2 and 5 it can be seen that in FIG. 5 the typical transient voltage dip effect of FIG. 2 is not present.

It will be understood to those skilled in the art that each of the components shown in block form in the various figures of the drawing can be readily implemented with commerically available components or can be readily implemented utilizing standard text book knowledge since the function of each block in the various drawings has been set forth.

Having thus described my invention, I claim:

1. In an electrical system for supplying electrical energy to a load from a first electrical supply and a second electrical supply and including first switch means for switching the load from the first electrical supply to the second electrical supply and second switch means for switching the load from the second electrical supply to the first electrical supply and wherein the first electrical supply comprises an inverter including voltage regulating means for regulating the output voltage of the inverter and phase control means for synchronizing the inverter to the second electrical supply the improvement comprising:

a. switch control means operatively connected to the first and second switch means for actuating the first and second switch means either alternately or simultaneously such that either the first or the second or both the first and second electrical supplies may be utilized to supply electrical energy to the load;

b. current sensing means operatively connected to the voltage regulating and phase control means of the inverter and to the second electrical supply for sensing the current of the second electrical supply when both the first and second electrical supplies are simultaneously supplying the load and for providing control signals to the voltage regulating and phase control means of the inverter in response to sensed output current of the second electrical supply;

c. said voltage regulating and phase control means each being responsive to control signals from the current sensing means for adjusting the output voltage of the inverter and its relative phase so as to null the output current of the second electrical supply such that the first electrical supply is supplying the entire energy of the load; and d. said switch control means being further operable to effect operation of the second switch means for switching the load from the second electrical supply solely to the first electrical supply when the current of the second electrical supply has been nulled.

2. In an electrical system for supplying electrical energy to a load from a first electrical supply and a second electrical supply and including first switch means for connecting the load to the first electrical supply and second switch means for connecting the load to the second electrical supply and wherein the first electrical supply comprises an inverter including voltage regulating means for regulating the output voltage of the inverter and phase control means for synchronizing the inverter to the second electrical supply, a method for transferring the load from the second electrical supply to the inverter without causing transient changes in the voltage and current fed to the load comprising the following steps in sequence:

a. with the load connected to the second electrical supply, effecting operation of the first switch means for paralleling the inverter to the load;

b. sensing the output current of the second electrical supply for providing control signals to the voltage regulating and phase control means of the inverter in response to sensed output current of the second electrical supply;

c. varying the output voltage of the inverter and its relative phase in response to the control signals thereby nulling the output current of the second electrical supply such that the inverter is supplying the entire energy of the load; and d. effecting operation of the second switch means when the output current of the second electrical supply has been nulled thereby disconnecting the load from the second electrical supply.

3. The method of claim 2 wherein the second electrical supply comprises a utility power supply.

* * * * *